United States Patent
Moden

(10) Patent No.: US 8,299,598 B2
(45) Date of Patent: *Oct. 30, 2012

(54) GRID ARRAY PACKAGES AND ASSEMBLIES INCLUDING THE SAME

(75) Inventor: Walter L. Moden, Meridian, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/714,163

(22) Filed: Feb. 26, 2010

(65) Prior Publication Data

US 2010/0148352 A1    Jun. 17, 2010

Related U.S. Application Data

(60) Continuation of application No. 11/866,065, filed on Oct. 2, 2007, now Pat. No. 8,198,138, which is a continuation of application No. 11/437,550, filed on May 19, 2006, now Pat. No. 7,381,591, which is a continuation of application No. 11/070,364, filed on Mar. 1, 2005, now Pat. No. 7,329,945, which is a continuation of application No. 09/699,537, filed on Oct. 30, 2000, now Pat. No. 6,861,290, which is a division of application No. 09/483,483, filed on Jan. 14, 2000, now Pat. No. 6,265,766, which is a continuation of application No. 08/948,936, filed on Oct. 10, 1997, now Pat. No. 6,201,304, which is a continuation of application No. 08/574,662, filed on Dec. 19, 1995, now Pat. No. 5,719,440.

(51) Int. Cl.
*H01L 23/48* (2006.01)

(52) U.S. Cl. ............... 257/690; 257/698; 257/E21.503; 257/E23.011; 257/E23.067; 438/118; 438/127

(58) Field of Classification Search .................. 438/118, 438/127, 667; 257/693, 697, 698, 701, 723, 257/774, 778, E21.503, E21.511, E23.011, 257/E23.067, 678, 690, E21.011

See application file for complete search history.

(56) References Cited

U.S. PATENT DOCUMENTS 3,648,131 A    3/1972  Stuby
(Continued)

FOREIGN PATENT DOCUMENTS

JP    60194548    10/1985
(Continued)

OTHER PUBLICATIONS

Anthony, T.R., "Forming electrical interconnections through semiconductor wafers," J. Appl. Phys., vol. 52, No. 8, Aug. 1981, pp. 5340-5349.

(Continued)

*Primary Examiner* — Khiem D Nguyen
(74) *Attorney, Agent, or Firm* — Lerner, David, Littenberg, Krumholz & Mentlik, LLP

(57) ABSTRACT

A semiconductor device assembly includes a substrate and a semiconductor die adjacent to a first surface of the substrate. The substrate also includes a second surface opposite from the first surface, an opening extending from the first surface and the second surface, contact pads on the second surface, and substrate pads on the second surface, adjacent to the opening. Bond pads of the semiconductor die are aligned with the opening through the substrate. Intermediate conductive elements, such as bond wires, extend from bond pads of the semiconductor die, through the opening, to substrate pads on the opposite, second surface of the substrate. An encapsulant, which fills the opening and covers the intermediate conductive elements, protrudes beyond a plane in which the second surface of the substrate is located. Discrete conductive elements, such as solder balls, may protrude from the contact pads of the substrate to connect the semiconductor device assembly to another component, such as a printed circuit board or another packaged semiconductor device.

47 Claims, 4 Drawing Sheets

U.S. PATENT DOCUMENTS

| | | | |
|---|---|---|---|
| 4,199,777 A | 4/1980 | Maruyama et al. | |
| 4,371,912 A | 2/1983 | Guzik | |
| 4,446,477 A | 5/1984 | Currie et al. | |
| 4,483,067 A | 11/1984 | Parmentier | |
| 4,505,799 A | 3/1985 | Baxter | |
| 4,638,348 A | 1/1987 | Brown et al. | |
| 4,649,418 A | 3/1987 | Uden | |
| 4,725,924 A | 2/1988 | Juan | |
| 4,731,645 A | 3/1988 | Parmentier et al. | |
| 4,761,681 A | 8/1988 | Reid | |
| 4,829,666 A | 5/1989 | Haghiri-Tehrani | |
| 4,841,355 A | 6/1989 | Parks | |
| 4,868,712 A | 9/1989 | Woodman | |
| 4,899,107 A | 2/1990 | Corbett et al. | |
| 4,931,853 A | 6/1990 | Ohuchi et al. | |
| 4,954,458 A | 9/1990 | Reid | |
| 4,956,694 A | 9/1990 | Eide | |
| 4,975,765 A | 12/1990 | Ackermann et al. | |
| 4,992,849 A | 2/1991 | Corbett et al. | |
| 4,992,850 A | 2/1991 | Corbett et al. | |
| 4,996,587 A | 2/1991 | Hinrichsmeyer et al. | |
| 5,012,323 A | 4/1991 | Farnworth | |
| 5,022,580 A | 6/1991 | Pedder | |
| 5,041,396 A | 8/1991 | Valero | |
| 5,043,794 A | 8/1991 | Tai et al. | |
| 5,048,179 A | 9/1991 | Shindo et al. | |
| 5,063,177 A | 11/1991 | Geller et al. | |
| 5,068,205 A | 11/1991 | Baxter et al. | |
| 5,075,253 A | 12/1991 | Sliwa et al. | |
| 5,086,018 A | 2/1992 | Conru et al. | |
| 5,099,309 A | 3/1992 | Kryzaniwsky | |
| 5,107,328 A | 4/1992 | Kinsman et al. | |
| 5,107,329 A | 4/1992 | Okinaga et al. | |
| 5,128,831 A | 7/1992 | Fox, III et al. | |
| 5,138,434 A | 8/1992 | Wood et al. | |
| 5,155,067 A | 10/1992 | Wood et al. | |
| 5,188,984 A | 2/1993 | Nishiguchi | |
| 5,191,511 A | 3/1993 | Sawaya | |
| 5,200,363 A | 4/1993 | Schmidt | |
| 5,216,278 A | 6/1993 | Lin et al. | |
| 5,218,234 A | 6/1993 | Thompson et al. | |
| 5,222,014 A | 6/1993 | Lin | |
| 5,231,304 A | 7/1993 | Solomon | |
| 5,239,198 A | 8/1993 | Lin et al. | |
| 5,239,447 A | 8/1993 | Cotues et al. | |
| 5,258,330 A | 11/1993 | Khandros et al. | |
| 5,266,912 A | 11/1993 | Kledzik | |
| 5,286,679 A | 2/1994 | Farnworth et al. | |
| 5,291,062 A | 3/1994 | Higgins, III et al. | |
| 5,293,068 A * | 3/1994 | Kohno et al. | 257/676 |
| 5,294,750 A | 3/1994 | Sakai et al. | |
| 5,299,092 A | 3/1994 | Yaguchi et al. | |
| 5,311,401 A | 5/1994 | Gates, Jr. et al. | |
| 5,313,096 A | 5/1994 | Eide | |
| 5,326,428 A | 7/1994 | Farnworth et al. | |
| 5,343,106 A | 8/1994 | Lungu et al. | |
| 5,346,859 A | 9/1994 | Niwayama | |
| 5,346,861 A | 9/1994 | Khandros et al. | |
| 5,360,942 A | 11/1994 | Hoffman et al. | |
| 5,373,189 A | 12/1994 | Massit et al. | |
| 5,384,689 A * | 1/1995 | Shen | 361/761 |
| 5,397,917 A | 3/1995 | Ommen et al. | |
| 5,397,921 A | 3/1995 | Karnezos | |
| 5,400,003 A | 3/1995 | Kledzik | |
| 5,409,865 A | 4/1995 | Karnezos | |
| 5,419,807 A | 5/1995 | Akram et al. | |
| 5,420,460 A | 5/1995 | Massingill | |
| 5,422,514 A | 6/1995 | Grisold et al. | |
| 5,426,072 A | 6/1995 | Finnila | |
| 5,434,106 A | 7/1995 | Lim et al. | |
| 5,434,452 A | 7/1995 | Higgins | |
| 5,454,161 A | 10/1995 | Beilin et al. | |
| 5,468,999 A | 11/1995 | Lin | |
| 5,473,512 A | 12/1995 | Degani et al. | |
| 5,474,957 A | 12/1995 | Urushima | |
| 5,486,723 A | 1/1996 | Ma et al. | |
| 5,489,804 A | 2/1996 | Pasch | |
| 5,508,556 A | 4/1996 | Lin | |
| 5,528,080 A | 6/1996 | Goldstein | |
| 5,536,685 A | 7/1996 | Burward-Hoy | |
| 5,541,450 A | 7/1996 | Jones et al. | |
| 5,545,291 A | 8/1996 | Smith et al. | |
| 5,578,525 A | 11/1996 | Mizukoshi | |
| 5,578,869 A | 11/1996 | Hoffman et al. | |
| 5,608,265 A | 3/1997 | Kitano et al. | |
| 5,615,089 A | 3/1997 | Yoneda et al. | |
| 5,616,958 A | 4/1997 | Laine et al. | |
| 5,625,221 A | 4/1997 | Kim et al. | |
| 5,625,227 A | 4/1997 | Estes et al. | |
| 5,636,104 A | 6/1997 | Oh | |
| 5,637,536 A | 6/1997 | Val | |
| 5,637,915 A | 6/1997 | Sato et al. | |
| 5,639,695 A | 6/1997 | Jones et al. | |
| 5,639,696 A | 6/1997 | Liang et al. | |
| 5,642,261 A | 6/1997 | Bond et al. | |
| 5,648,679 A | 7/1997 | Chillara et al. | |
| 5,663,593 A | 9/1997 | Mostafazadeh et al. | |
| 5,668,405 A | 9/1997 | Yamashita | |
| 5,674,785 A * | 10/1997 | Akram et al. | 438/15 |
| 5,675,180 A | 10/1997 | Pedersen et al. | |
| 5,677,566 A | 10/1997 | King et al. | |
| 5,682,061 A | 10/1997 | Khandros et al. | |
| 5,689,091 A | 11/1997 | Hamzehdoost et al. | |
| 5,696,033 A | 12/1997 | Kinsman | |
| 5,714,405 A | 2/1998 | Tsubosaki et al. | |
| 5,723,907 A | 3/1998 | Akram | |
| 5,729,432 A | 3/1998 | Shim et al. | |
| 5,734,198 A | 3/1998 | Stave | |
| 5,739,585 A | 4/1998 | Akram et al. | |
| 5,739,588 A | 4/1998 | Ishida et al. | |
| 5,741,622 A | 4/1998 | Arima | |
| 5,744,862 A | 4/1998 | Ishii | |
| 5,767,575 A | 6/1998 | Lan et al. | |
| 5,770,347 A | 6/1998 | Saitoh et al. | |
| 5,780,923 A | 7/1998 | Courtenay | |
| 5,783,866 A | 7/1998 | Lee et al. | |
| 5,783,870 A | 7/1998 | Mostafazadeh et al. | |
| 5,789,803 A | 8/1998 | Kinsman | |
| 5,796,586 A | 8/1998 | Lee et al. | |
| 5,804,874 A | 9/1998 | An et al. | |
| 5,804,880 A | 9/1998 | Mathew | |
| 5,811,879 A | 9/1998 | Akram | |
| 5,814,883 A | 9/1998 | Sawai et al. | |
| 5,815,372 A | 9/1998 | Gallas | |
| 5,818,698 A | 10/1998 | Corisis | |
| 5,834,945 A | 11/1998 | Akram et al. | |
| 5,835,988 A | 11/1998 | Ishii | |
| 5,844,315 A | 12/1998 | Melton et al. | |
| 5,848,467 A | 12/1998 | Khandros et al. | |
| 5,852,326 A | 12/1998 | Khandros et al. | |
| 5,883,426 A | 3/1999 | Tokuno et al. | |
| 5,893,726 A | 4/1999 | Farnworth et al. | |
| 5,903,049 A | 5/1999 | Mori | |
| 5,915,169 A | 6/1999 | Heo | |
| 5,915,977 A | 6/1999 | Hembree et al. | |
| 5,920,118 A | 7/1999 | Kong | |
| 5,931,685 A | 8/1999 | Hembree et al. | |
| 5,933,710 A | 8/1999 | Chia et al. | |
| 5,950,304 A | 9/1999 | Khandros et al. | |
| 5,952,611 A | 9/1999 | Eng et al. | |
| 5,962,921 A | 10/1999 | Farnworth et al. | |
| 5,963,430 A | 10/1999 | Londa | |
| 5,990,547 A | 11/1999 | Sharma et al. | |
| 5,994,166 A | 11/1999 | Akram et al. | |
| 6,013,946 A | 1/2000 | Lee et al. | |
| 6,013,948 A | 1/2000 | Akram et al. | |
| 6,020,629 A | 2/2000 | Farnworth et al. | |
| 6,028,365 A | 2/2000 | Akram et al. | |
| 6,046,072 A | 4/2000 | Matsuura et al. | |
| 6,048,755 A | 4/2000 | Jiang et al. | |
| 6,057,597 A | 5/2000 | Farnworth et al. | |
| 6,072,233 A | 6/2000 | Corisis et al. | |
| 6,091,140 A | 7/2000 | Toh et al. | |
| 6,097,085 A | 8/2000 | Ikemizu et al. | |
| 6,097,087 A | 8/2000 | Farnworth et al. | |
| 6,107,109 A | 8/2000 | Akram et al. | |
| 6,133,627 A | 10/2000 | Khandros et al. | |

| | | |
|---|---|---|
| 6,201,304 B1 | 3/2001 | Moden |
| 6,235,554 B1 | 5/2001 | Akram et al. |
| 6,262,477 B1 | 7/2001 | Mahulikar et al. |
| 6,265,766 B1 * | 7/2001 | Moden .................. 257/678 |
| 6,268,649 B1 | 7/2001 | Corisis et al. |
| 6,331,939 B1 | 12/2001 | Corisis et al. |
| 6,372,527 B1 | 4/2002 | Khandros et al. |
| 6,392,306 B1 | 5/2002 | Khandros et al. |
| 6,433,419 B2 | 8/2002 | Khandros et al. |
| 6,455,928 B2 | 9/2002 | Corisis et al. |
| 6,465,893 B1 | 10/2002 | Khandros et al. |
| 6,512,303 B2 | 1/2003 | Moden |
| 6,549,421 B2 | 4/2003 | Corisis et al. |
| 6,667,556 B2 | 12/2003 | Moden |
| 6,670,702 B2 | 12/2003 | Corisis et al. |
| 6,738,263 B2 | 5/2004 | Corisis et al. |
| 6,825,569 B2 | 11/2004 | Jiang et al. |
| 6,861,290 B1 | 3/2005 | Moden |
| 6,869,827 B2 | 3/2005 | Vaiyapuri et al. |
| 7,329,945 B2 | 2/2008 | Moden |
| 7,381,591 B2 | 6/2008 | Moden |
| 2001/0030370 A1 | 10/2001 | Khandros et al. |
| 2002/0000652 A1 | 1/2002 | Goh |
| 2002/0155728 A1 | 10/2002 | Khandros et al. |
| 2003/0168253 A1 | 9/2003 | Khandros et al. |
| 2005/0087855 A1 | 4/2005 | Khandros et al. |
| 2008/0023853 A1 | 1/2008 | Moden |

FOREIGN PATENT DOCUMENTS

| | | |
|---|---|---|
| JP | 430544 | 2/1992 |
| JP | 4107964 | 4/1992 |
| JP | 07283274 | 10/1995 |

OTHER PUBLICATIONS

"Chip Scale Review," vol. 1, No. 1, May 1997.

Roget's II, The New Thesaurus, 3rd Edition, Houghton Mifflin Company, 1995, p. 213.

Random House Webster's College Dictionary, Random House, New York, 1997, p. 297.

* cited by examiner

GRID ARRAY PACKAGES AND ASSEMBLIES INCLUDING THE SAME

CROSS-REFERENCE TO RELATED APPLICATIONS

This application is a continuation of U.S. patent application Ser. No. 11/866,065, filed Oct. 2, 2007, now U.S. Pat. No. 8,198,138, issued Jun. 12, 2012, which is a continuation of U.S. patent application Ser. No. 11/437,550, filed May 19, 2006, now U.S. Pat. No. 7,381,591, issued Jun. 3, 2008, which is a continuation of U.S. patent application Ser. No. 11/070,364, filed Mar. 1, 2005, now U.S. Pat. No. 7,329,945, issued Feb. 12, 2008, which is a continuation of U.S. patent application Ser. No. 09/699,537, filed Oct. 30, 2000, now U.S. Pat. No. 6,861,290, issued Mar. 1, 2005, which is a divisional of U.S. patent application Ser. No. 09/483,483, filed Jan. 14, 2000, now U.S. Pat. No. 6,265,766, issued Jul. 24, 2001, which is a continuation of U.S. patent application Ser. No. 08/948,936, filed Oct. 10, 1997, now U.S. Pat. No. 6,201,304, issued Mar. 13, 2001, which is a continuation of U.S. patent application Ser. No. 08/574,662, filed Dec. 19, 1995, now U.S. Pat. No. 5,719,440, issued Feb. 17, 1998. The disclosure of each of the previously referenced U.S. patent applications and patents is hereby incorporated herein by this reference in its entirety.

BACKGROUND OF THE INVENTION

1. Field of the Invention

The present invention relates to an apparatus for connecting a bare semiconductor die having a size and bond pad arrangement, either solder ball arrangement, or pin arrangement (hereinafter referred to generally as a "terminal arrangement"), which does not conform to a printed circuit board with a specific or standardized pin out, connector pad, or lead placement (hereinafter referred to generally as a "connection arrangement"). More particularly, the present invention relates to an intermediate conductor-carrying substrate (hereinafter referred to generally as an "adaptor board") for connecting a non-conforming bare die to another printed circuit board having a given connection arrangement (hereinafter referred to generally as a "master board").

2. State of the Art

Definitions: The following terms and acronyms will be used throughout the application and are defined as follows:

BGA—Ball Grid Array: An array of minute solder balls disposed on an attachment surface of a semiconductor die wherein the solder balls are refluxed for simultaneous attachment and electrical communication of the semiconductor die to a printed circuit board.

COB—Chip On Board: The techniques used to attach semiconductor dice to a printed circuit board, including flip-chip attachment, wire bonding, and tape automated bonding ("TAB").

Flip-Chip: A chip or die that has bumped terminations spaced around the active surface of the die and is intended for facedown mounting.

Flip-Chip Attachment: A method of attaching a semiconductor die to a substrate in which the die is flipped so that the connecting conductor pads on the face of the die are set on mirror-image pads on the substrate (i.e., printed circuit board) and bonded by refluxing the solder.

Glob Top: A glob of encapsulant material (usually epoxy or silicone or a combination thereof) surrounding a semiconductor die in the COB assembly process.

PGA—Pin Grid Array: An array of small pins extending substantially perpendicularly from the major plane of a semiconductor die, wherein the pins conform to a specific arrangement on a printed circuit board for attachment thereto.

SLICC—Slightly Larger than Integrated Circuit Carrier: An array of minute solder balls disposed on an attachment surface of a semiconductor die similar to a BGA, but having a smaller solder ball pitch and diameter than a BGA.

State-of-the-art COB technology generally consists of three semiconductor die to printed circuit board attachment techniques: flip-chip attachment, wire bonding, and TAB.

Flip-chip attachment consists of attaching a semiconductor die, generally having a BGA, a SLICC or a PGA, to a printed circuit board. With the BGA or SLICC, the solder ball arrangement on the semiconductor die must be a mirror-image of the connecting bond pads on the printed circuit board such that precise connection is made. The semiconductor die is bonded to the printed circuit board by refluxing the solder balls. With the PGA, the pin arrangement of the semiconductor die must be a mirror-image of the pin recesses on the printed circuit board. After insertion, the semiconductor die is generally bonded by soldering the pins into place. An under-fill encapsulant is generally disposed between the semiconductor die and the printed circuit board to prevent contamination. A variation of the pin-in-recess PGA is a J-lead PGA, wherein the loops of the Js are soldered to pads on the surface of the circuit board. Nonetheless, the lead and pad locations must coincide, as with the other referenced flip-chip techniques.

Wire bonding and TAB attachment generally begins with attaching a semiconductor die to the surface of a printed circuit board with an appropriate adhesive. In wire bonding, a plurality of bond wires are attached, one at a time, from each bond pad on the semiconductor die and to a corresponding lead on the printed circuit board. The bond wires are generally attached through one of three industry-standard wire bonding techniques: ultrasonic bonding, using a combination of pressure and ultrasonic vibration bursts to form a metallurgical cold weld; thermocompression bonding, using a combination of pressure and elevated temperature to form a weld; and thermosonic bonding, using a combination of pressure, elevated temperature, and ultrasonic vibration bursts. The die may be oriented either face up or face down (with its active surface and bond pads either up or down with respect to the circuit board) for wire bonding, although face up orientation is more common. With TAB, metal tape leads are attached between the bond pads on the semiconductor die and the leads on the printed circuit board. An encapsulant is generally used to cover the bond wires and metal tape leads to prevent contamination.

Although the foregoing methods are effective for bonding semiconductor dice to printed circuit boards, the terminal arrangements of the dice and the connection arrangements of the boards must be designed to accommodate one another. Thus, it may be impossible to electrically connect a particular semiconductor die to a printed circuit board for which the semiconductor die terminal arrangement was not designed to match the board's connection arrangement. With either wire bond or TAB attachment, the semiconductor die bond pad may not correspond to the lead ends on the circuit board, and thus attachment is either impossible or extremely difficult due to the need for overlong wires and the potential for inter-wire contact and shorting. With flip-chip attachment, if the printed circuit board connection arrangement is not a mirror-image of the solder ball or pin arrangement (terminal arrangement) on the semiconductor die, electrically connecting the flip-chip to the printed circuit board is impossible.

Therefore, it would be advantageous to develop an apparatus for connecting a semiconductor die having a size and bond pad arrangement, solder ball arrangement, or pin arrangement ("I/O pattern") which does not conform to a printed circuit board with a specific or standardized pin out, connection pad location, or lead placement ("I/O pattern").

SUMMARY OF THE INVENTION

The present invention relates to an intermediate printed circuit board or other conductor-carrying substrate that functions as an adaptor board for electrically connecting one or more bare semiconductor dice of a variety of sizes and bond pad locations, solder ball arrangement, or pin arrangement, to a master printed circuit board with a specific or standardized pin out, connector pad location, or lead placement.

An adaptor printed circuit board or substrate ("adaptor board") is sized and configured with an I/O pattern to accommodate its attachment to the master printed circuit board ("master board"). If the master board is configured to receive a specific pin out or specific connector pad locations, the adaptor board is configured on its master board attachment surface with pins or solder balls in mirror-image to the master board connection arrangement to make electrical contact with the specific pin out or connector pads on the printed circuit board. If the master board is configured to receive a bond wire, the adaptor board is configured and sized to provide wire bond pads on its upper surface closely adjacent the bond pads of the master board leads. The adaptor board can, of course, be configured to accommodate other attachment and electrical connection means known in the industry, as well as other components in addition to the semiconductor die or dice carried thereon.

On the semiconductor die side of the adaptor board, one or more semiconductor dice are attached. If a "flip-chip" die is attached to the adaptor board, the adaptor board will, of course, be configured with an I/O pattern to receive the flip-chip with a specific pin out or connector pad locations. The pin out or connector pads on the adaptor board are connected to circuit traces on or through the adaptor board. The circuit traces form the electrical communication path from the pin recesses or connector pads on the adaptor board to the connection points to the master board.

If a "leads over" die is used with the adaptor board, the bond pads on the die are wire bonded to the adaptor board. Preferably, the leads over die is attached to the adaptor board with the bond pads facing the adaptor board. The bond wires are attached to the leads over die bond pads and extend into a via or vias in the adaptor board. The bond wires are attached to an I/O pattern of adaptor board bond pads within the via from which circuit traces extend, or to leads on the master board side of the adaptor board.

It is, of course, understood that the leads over die can be attached to the adaptor board with the bond pads facing away from the adaptor board. Thus, the bond wires are simply attached to the bond pads on the leads over die and to a corresponding I/O pattern of adaptor board pad on the semiconductor die side of the adaptor board.

Preferably, the exposed circuitry of the die and the die-to-adaptor board interconnection is sealed from contamination by a glob top after wire bonding or an underflow compound in the case of a flip-chip attachment.

Furthermore, it is understood that with the use of wire bonds, the adaptor boards can be stacked on top of each other and connected to the adaptor board as by wire bonding.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
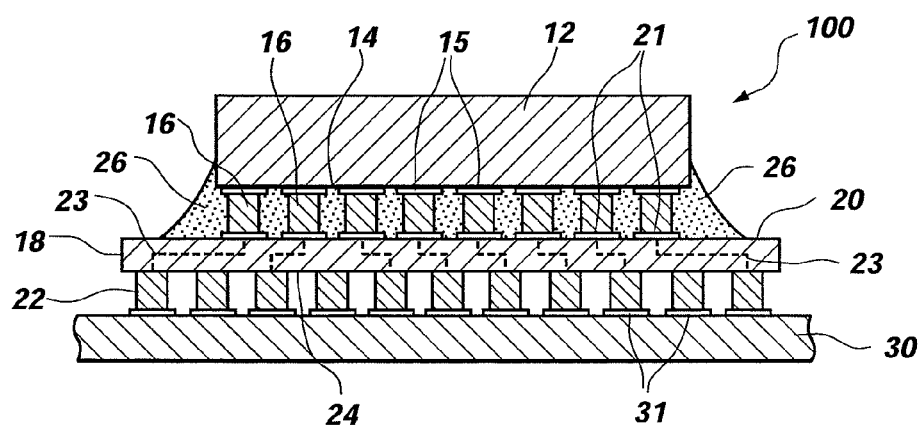
FIG. 1 is a side view of one embodiment of the present invention.

FIG. 1 illustrates a first embodiment of the present invention designated as a flip-chip style/flip-chip attachment assembly 100. Assembly 100 comprises a semiconductor die 12 having an inverted active surface 14 with at least one flip-chip electric connection 16 (such as a C4 solder bump connection, a pin connection, or a surface mount J-lead connection, by way of example) extending substantially perpendicularly from a bond pad 15 on the semiconductor die active surface 14. The flip-chip electric connections 16 are attached to an upper surface 20 of an adaptor board 18 in such a manner that the flip-chip electric connections 16 make electrical contact with electrical contact elements 21 in or on the surface of adaptor board 18. The electrical contact elements 21 make electrical communication between each flip-chip electric connection 16, through circuit traces 23 (exemplary traces shown in broken lines) in the adaptor board 18, to at least one master board connector 22 extending substantially perpendicularly from a lower surface 24 of the adaptor board 18 to connect adaptor board 18 to an aligned terminal 31 on master board 30. Preferably, a sealing compound 26 is disposed between the semiconductor die 12 and the adaptor board 18 to prevent contamination of the flip-chip electric connections 16 and to more firmly secure semiconductor die 12 to adaptor board 18.

In actual practice, there will be a plurality of terminals 31 arranged in a specific, perhaps industry-standard pattern, on master board 30, and master board connectors 22 will be arranged in a mirror-image pattern to terminals 31 for mating connection therewith. Master board connectors 22 and terminals 31 may comprise any electrical connection mechanism known in the art, in addition to those previously described herein.

Figure 2:
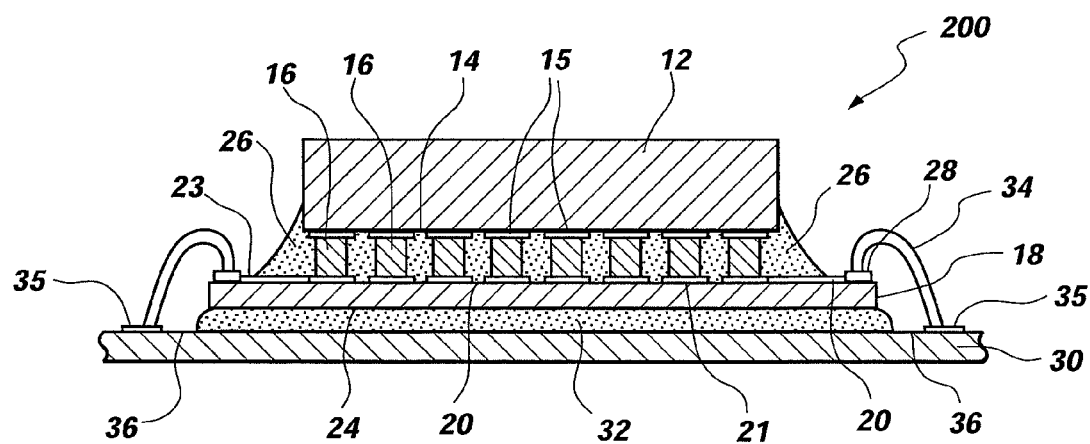
FIG. 2 is a side view of a second embodiment of the present invention.
Figure 2A:
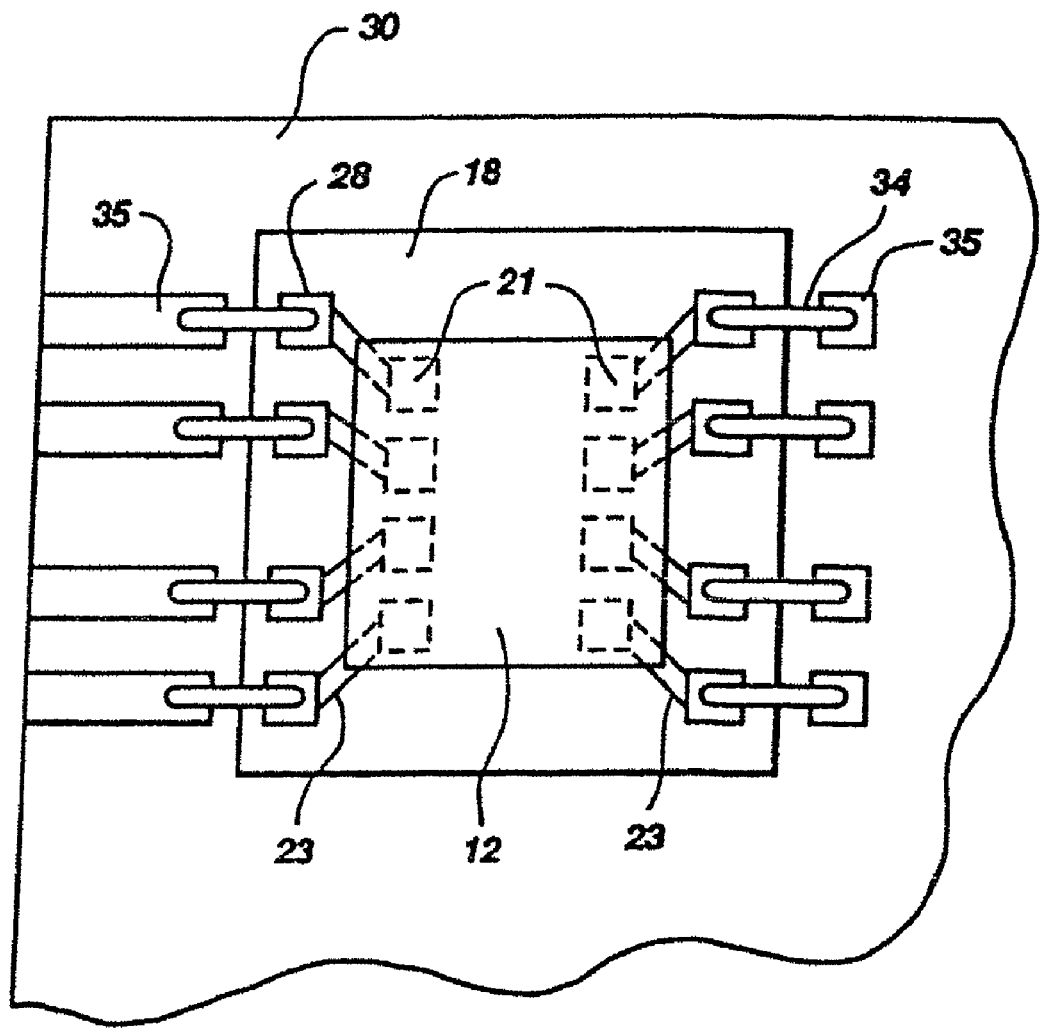
FIG. 2A is a top view of the second embodiment of the present invention shown in FIG. 2.

FIGS. 2 and 2A illustrate a second embodiment of the present invention designated as a flip-chip style/wire bond attachment assembly 200. Components common to both FIG. 1 and FIG. 2 retain the same numeric designation. The assembly 200 comprises the semiconductor die 12 having active surface 14 with at least one flip-chip electric connection 16, as known in the art, extending substantially perpendicularly from a bond pad 15 on the semiconductor die active surface 14. The flip-chip electric connections 16 are attached to the adaptor board upper surface 20 in such a manner that the flip-chip electric connections 16 make electrical contact with electrical contact elements 21 on the adaptor board 18. The electrical contact elements 21 communicate between each flip-chip electric connection 16 to bond pads 28 on the adaptor board upper surface 20 through circuit traces 23. The adaptor board lower surface 24 is bonded to an upper surface 36 of a master board 30 with an adhesive 32, which may comprise a liquid or gel adhesive, or an adhesive tape, all as known in the art. If desired, adhesive 32 may be a heat-conductive adhesive. A wire bond 34 extends from each adaptor board bond pad 28 to a corresponding bond pad or lead end 35 on the upper surface 36 of master board 30, bond pad or lead end 35 communicating with other components mounted to master board 30 or with other components on other boards or other assemblies through circuit traces or other conductors known in the art.

Figure 3:
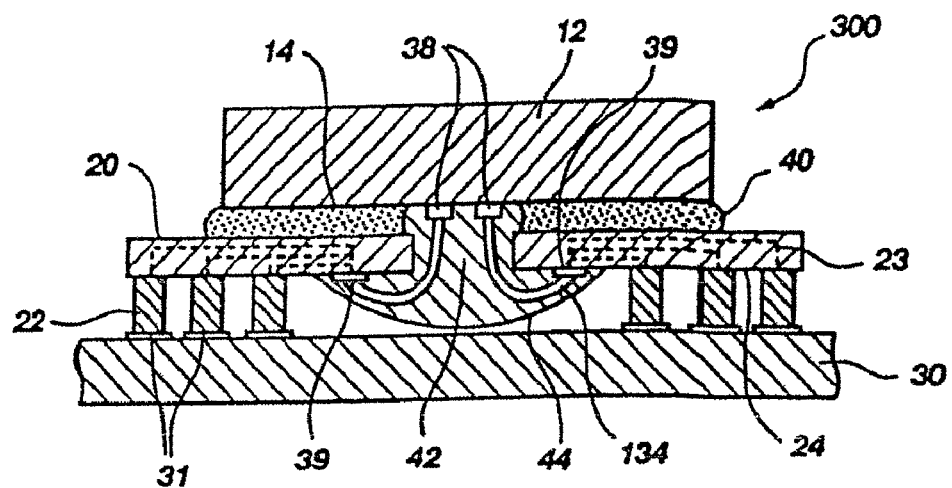
FIG. 3 is a side view of a third embodiment of the present invention.
Figure 3A:
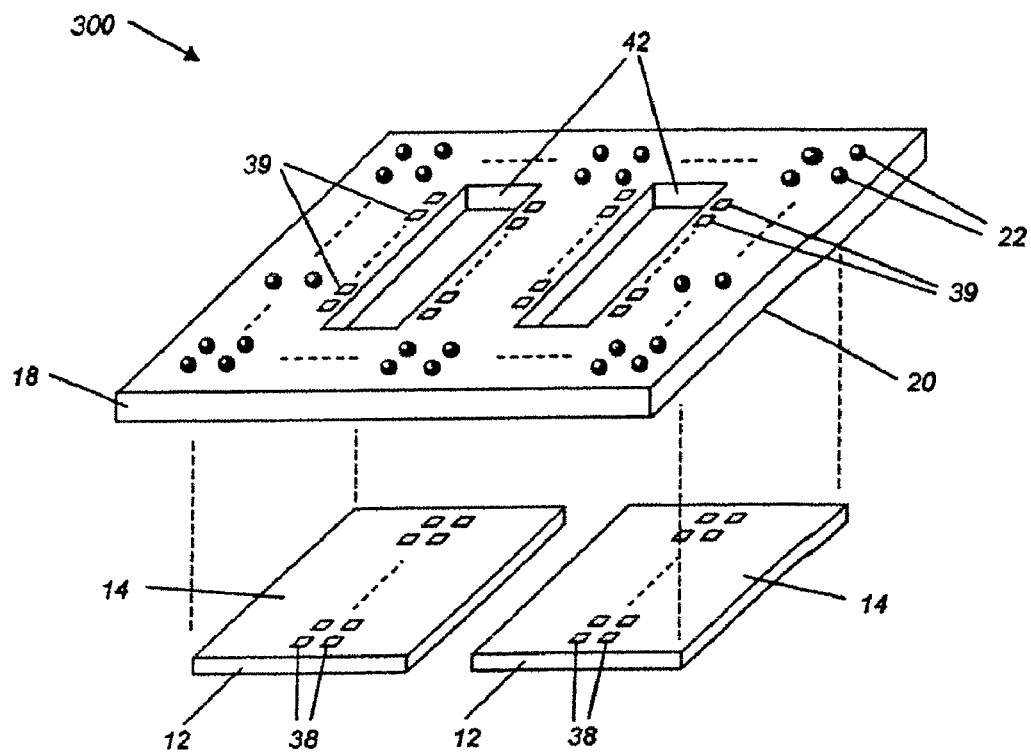
FIG. 3A is an upside-down exploded perspective view of selected portions of the third embodiment.

FIGS. 3 and 3A illustrate a third embodiment of the present invention designated as a wire bond style/flip-chip attachment assembly 300. Components which are common to the previous figures retain the same numeric designation. The assembly 300 comprises an inverted semiconductor die 12 having active surface 14 with at least one bond pad 38 on the semiconductor die active surface 14. As illustrated, the bond pads 38 are arranged in two rows extending down the longitudinal axis of semiconductor die 12 being located transverse to the plane of the page, such an arrangement commonly being used for a "leads over" connection to frame leads extending over the die in its normal, upright position. The semiconductor die active surface 14 is bonded to the adaptor board upper surface 20 with an insulating, sealing adhesive 40. The adaptor board 18 includes at least one or more wire bond vias 42 which is located in a position or positions aligned with the semiconductor die bond pads 38. Each individual wire bond 134 is connected to each corresponding individual semiconductor die bond pad 38. Each wire bond 134 extends from the semiconductor die bond pad 38 to a corresponding bond pad or lead 39 on the adaptor board lower surface 24, which communicates with master board connectors 22 through circuit traces 23. The master board terminals 31 are in electrical communication with at least one master board connector 22 extending substantially perpendicularly from the adaptor board lower surface 24. Preferably, a sealant 44 encases the bond wires 134 and seals the wire bond via 42 to prevent contamination and damage to the wire bonds.

Figure 4:
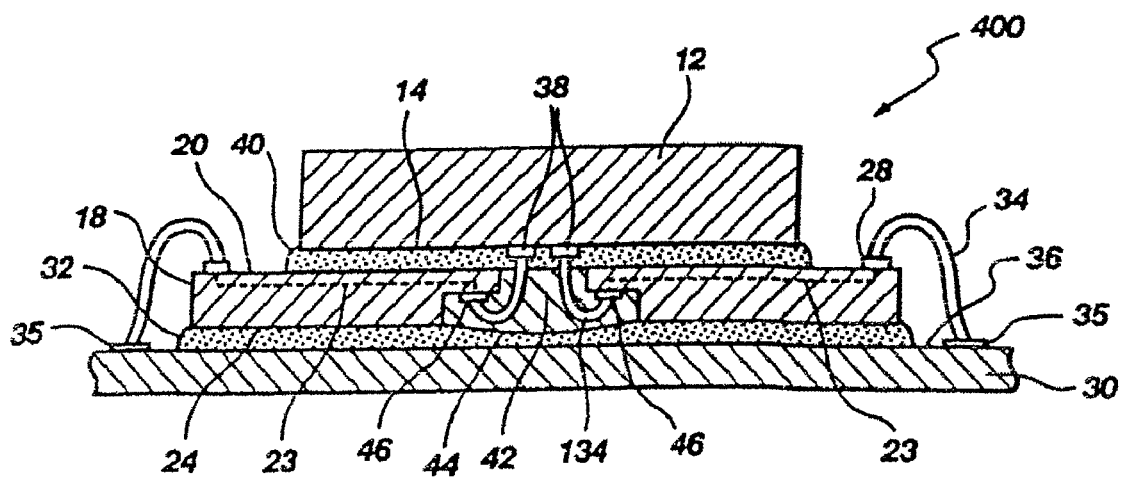
FIG. 4 is a side view of a fourth embodiment of the present invention.

FIG. 4 illustrates a fourth embodiment of the present invention designated as a wire bond style/wire bond attachment assembly 400. Components which are common to the previous figures retain the same numeric designation. The assembly 400 comprises the semiconductor die 12 having active surface 14 with at least one bond pad 38 on the semiconductor die active surface 14. As with the embodiment of FIG. 3, semiconductor die 12 in this instance employs bond pads 38 in a "leads over" configuration. The semiconductor die active surface 14 is bonded to the adaptor board upper surface 20 with an insulating, sealing adhesive 40. The adaptor board 18 includes at least one or more wire bond vias 42 which are located in a position or positions aligned with the semiconductor die bond pads 38. Each individual wire bond 134 is connected to each corresponding semiconductor die bond pad 38. Each wire bond 134 extends from the semiconductor die bond pad 38 to a corresponding bond pad 46 within the wire bond via 42. The via bond pads 46 are in electrical communication through circuit traces 23 with at least one corresponding adaptor board bond pad 28. The adaptor board lower surface 24 is bonded to the master board upper surface 36 with the adhesive 32. Wire bonds 34 extend from the adapter board upper surface 20 to a corresponding bond pad or lead end 35 on the master board upper surface 36. Preferably, the wire bond via sealant 44 encases the bond wires 134 and seals the wire bond via 42 to prevent contamination.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. An apparatus, comprising:
  a package, including:
    a substrate with an elongate opening therethrough, wherein the substrate comprises a die attach surface, a second surface opposite from the die attach surface, a plurality of first rows of substrate pads adjacent to a first side of the elongate opening, and a plurality of second rows of substrate pads adjacent to a second side of the elongate opening;
    a semiconductor die on the die attach surface of the substrate, the semiconductor die including an active surface and die pads at the active surface;
    bond wires extending from the die pads, through the opening, and to the substrate pads;
    encapsulant covering the bond wires and protruding a first profile distance beyond a plane in which the second surface of the substrate is located;
    solder balls protruding a second profile distance from the substrate, the second profile distance being about the same as or greater than the first profile distance; and
  a printed circuit board including:
    connector pads to which the solder balls are secured; and
    conductive traces for establishing electrical communication between the connector pads and at least one electrical component mounted to the printed circuit board.

2. The apparatus of claim 1, wherein the active surface of the semiconductor die faces the die attach surface of the substrate.

3. The apparatus of claim 1, wherein the package further includes:
  adhesive securing the semiconductor die to the substrate.

4. The apparatus of claim 3, wherein the adhesive extends laterally beyond an outer periphery of the semiconductor die.

5. The apparatus of claim 3, wherein the adhesive does not extend laterally beyond an inner periphery of the substrate that defines the elongate opening.

6. The apparatus of claim 3, wherein the adhesive comprises an adhesive-coated tape or an adhesive-coated film.

7. The apparatus of claim 1, further comprising:
  another package stacked on top of the package.

8. The apparatus of claim 7, wherein the package and the another package are substantially identical.

9. The apparatus of claim 1, wherein the semiconductor die of the package includes a first row of die pads and a second row of die pads.

10. The apparatus of claim 9, wherein:
  first bond wires establish electrical communication between first die pads of the first row of die pads and the corresponding first rows of substrate pads; and
  second bond wires establish electrical communication between second die pads of the second row of die pads and the corresponding second rows of substrate pads.

11. The apparatus of claim 1, wherein the solder balls protrude from the second surface of the substrate.

12. The apparatus of claim 11, wherein at least some of the solder balls are located at positions on the second surface of the substrate that are superimposed by the semiconductor die on the die attach surface of the substrate.

13. The apparatus of claim 11, wherein at least some of the solder balls are located at positions on the second surface of the substrate that are located outside an area of the second surface that is superimposed by the semiconductor die on the die attach surface of the substrate.

14. The apparatus of claim 13, wherein at least some of the solder balls are located at positions in the area of the second surface of the substrate that is superimposed by the semiconductor die on the die attach surface of the substrate.

15. An apparatus, comprising:
a first package; and
a second package on which the first package is stacked, the second package including:
  a substrate with an elongate opening therethrough, wherein the substrate comprises a die attach surface, a second surface opposite from the die attach surface, a plurality of first rows of substrate pads adjacent to a first side of the elongate opening, and a plurality of second rows of substrate pads adjacent to a second side of the elongate opening;
  a semiconductor die on the die attach surface of the substrate, the semiconductor die including an active surface and die pads at the active surface;
  bond wires extending from the die pads, through the opening, and to the substrate pads;
  encapsulant covering the bond wires and protruding a first profile distance beyond a plane in which the second surface of the substrate is located;
  solder balls protruding a second profile distance from the substrate, the second profile distance being about the same as or greater than the first profile distance; and
  a printed circuit board including:
    connector pads to which the solder balls are secured; and
    conductive traces for establishing electrical communication between the connector pads and at least one electrical component mounted to the printed circuit board.

16. The apparatus of claim 15, wherein the active surface of the semiconductor die faces the die attach surface of the substrate.

17. The apparatus of claim 15, wherein the second package further includes:
adhesive securing the semiconductor die to the substrate.

18. The apparatus of claim 17, wherein the adhesive extends laterally beyond an outer periphery of the semiconductor die.

19. The apparatus of claim 17, wherein the adhesive does not extend laterally beyond an inner periphery of the substrate that defines the elongate opening.

20. The apparatus of claim 17, wherein the adhesive comprises an adhesive-coated tape or an adhesive-coated film.

21. The apparatus of claim 15, wherein the first package and the second package are substantially identical.

22. The apparatus of claim 15, wherein the semiconductor die of the second package includes a first row of die pads and a second row of die pads.

23. The apparatus of claim 22, wherein:
first bond wires establish electrical communication between first die pads of the first row of die pads and the first rows of substrate pads; and
second bond wires establish electrical communication between second die pads of the second row of die pads and the second rows of substrate pads.

24. The apparatus of claim 15, wherein the solder balls protrude from the second surface of the substrate.

25. The apparatus of claim 24, wherein at least some of the solder balls are located at positions on the second surface of the substrate that are superimposed by the semiconductor die on the die attach surface of the substrate.

26. The apparatus of claim 24, wherein at least some of the solder balls are located at positions on the second surface of the substrate that are located outside an area of the second surface that is superimposed by the semiconductor die on the die attach surface of the substrate.

27. The apparatus of claim 26, wherein at least some of the solder balls are located at positions in the area of the second surface of the substrate that is superimposed by the semiconductor die on the die attach surface of the substrate.

28. A semiconductor device assembly, comprising:
a substrate with an opening therethrough;
a semiconductor die adjacent to a first surface of the substrate, the semiconductor die including bond pads aligned with the opening;
intermediate conductive elements extending from the bond pads of the semiconductor die to corresponding substrate pads on a second surface of the substrate, the corresponding substrate pads being located adjacent to the opening, wherein the substrate pads comprises a plurality of first rows of substrate pads adjacent to a first side of the opening and a plurality of second rows of substrate pads adjacent to a second side of the opening; and
an encapsulant filling the opening and covering the intermediate conductive elements and the substrate pads, the encapsulant protruding beyond a plane in which the second surface of the substrate is located.

29. The semiconductor device assembly of claim 28, wherein the intermediate conductive elements comprise bond wires.

30. The semiconductor device assembly of claim 28, wherein the opening comprises an elongate opening.

31. The semiconductor device assembly of claim 28, further comprising:
discrete conductive elements secured to contacts of the substrate, the contacts in electrical communication with the corresponding substrate pads.

32. The semiconductor device assembly of claim 31, wherein the discrete conductive elements comprise solder balls.

33. The semiconductor device assembly of claim 31, wherein the contacts of the substrate from which the discrete conductive elements protrude are located on the second surface of the substrate.

34. The semiconductor device assembly of claim 33, wherein the discrete conductive elements protrude beyond the plane in which the second surface of the substrate is located.

35. The semiconductor device assembly of claim 34, wherein the discrete conductive elements protrude a same distance beyond the plane in which the second surface of the substrate is located as a distance the encapsulant protrudes beyond the plane.

36. The semiconductor device assembly of claim 34, wherein the discrete conductive elements protrude a greater distance beyond the plane in which the second surface of the substrate is located than a distance the encapsulant protrudes beyond the plane.

37. The semiconductor device assembly of claim 33, wherein at least some of the discrete conductive elements are located at positions on the second surface of the substrate that are superimposed by the semiconductor die on the first surface of the substrate.

38. The semiconductor device assembly of claim 33, wherein at least some of the discrete conductive elements are located at positions on the second surface of the substrate that are located outside an area of the second surface that is superimposed by the semiconductor die on the first surface of the substrate.

39. The semiconductor device assembly of claim 38, wherein at least some of the discrete conductive elements are located at positions in the area of the second surface of the substrate that is superimposed by the semiconductor die on the first surface of the substrate.

40. The semiconductor device assembly of claim 39, further comprising:

a carrier including terminals to which the discrete conductive elements are secured.

41. The semiconductor device assembly of claim 39, wherein a bond pad bearing surface of the semiconductor die faces the first surface of the substrate.

42. The semiconductor device assembly of claim 28, further comprising:

adhesive securing the semiconductor die to the substrate.

43. The semiconductor device assembly of claim 42, wherein the adhesive extends laterally beyond an outer periphery of the semiconductor die.

44. The semiconductor device assembly of claim 42, wherein the adhesive does not extend laterally beyond an inner periphery of the substrate that defines the opening.

45. The semiconductor device assembly of claim 42, wherein the adhesive comprises an adhesive-coated tape or an adhesive-coated film.

46. The semiconductor device assembly of claim 28, wherein the semiconductor die includes a first row of die pads and a second row of die pads.

47. The semiconductor device assembly of claim 46, wherein:

first intermediate conductive elements establish electrical communication between first die pads of the first row of die pads and the first rows of substrate pads; and second intermediate conductive elements establish electrical communication between second die pads of the second row of die pads and the second rows of substrate pads.

* * * * *